(12) United States Patent
Omori et al.

(10) Patent No.: US 7,728,414 B2
(45) Date of Patent: Jun. 1, 2010

(54) LEAD FRAME AND RESIN-ENCAPSULATED SEMICONDUCTOR DEVICE

(75) Inventors: Kouji Omori, Shiga (JP); Hideki Sakoda, Kyoto (JP)

(73) Assignee: Panasonic Corporation, Osaka (JP)

( * ) Notice: Subject to any disclaimer, the term of this patent is extended or adjusted under 35 U.S.C. 154(b) by 43 days.

(21) Appl. No.: 11/414,374

(22) Filed: May 1, 2006

(65) Prior Publication Data

US 2006/0255438 A1 Nov. 16, 2006

(30) Foreign Application Priority Data

May 10, 2005 (JP) .............................. 2005-137707

(51) Int. Cl.
*H01L 23/495* (2006.01)
(52) U.S. Cl. ................. 257/676; 257/E23.037
(58) Field of Classification Search .......... 257/E23.037
See application file for complete search history.

(56) References Cited

U.S. PATENT DOCUMENTS

| 5,334,872 | A | * | 8/1994 | Ueda et al. .................. 257/675 |
| 5,872,395 | A | * | 2/1999 | Fujimoto .................... 257/675 |
| 6,188,130 | B1 | * | 2/2001 | Ramirez et al. ............. 257/706 |
| 6,281,568 | B1 | * | 8/2001 | Glenn et al. ................ 257/684 |
| 6,638,790 | B2 | * | 10/2003 | Minamio et al. ............ 438/111 |
| 6,737,737 | B1 | * | 5/2004 | Chang et al. ................ 257/676 |
| 2002/0096790 | A1 | * | 7/2002 | Kasuya ...................... 257/787 |
| 2003/0001244 | A1 | * | 1/2003 | Araki et al. ................ 257/666 |
| 2003/0001289 | A1 | | 1/2003 | Yamada et al. |
| 2003/0127711 | A1 | | 7/2003 | Kawai et al. |

FOREIGN PATENT DOCUMENTS

JP 05-136320 6/1993

(Continued)

OTHER PUBLICATIONS

Japanese Office Action, with English Translation, issued in Corresponding Japanese Patent Application No. 2005-137707, dated on Dec. 4, 2007.

(Continued)

*Primary Examiner*—Sue A Purvis
*Assistant Examiner*—Benjamin P Sandvik
(74) *Attorney, Agent, or Firm*—McDermott Will & Emery LLP (57) ABSTRACT

A power QFN package includes signal leads, a die pad, support leads, and an adhesive for die bonding. These elements are encapsulated with a resin encapsulant. The lower parts of the signal leads are exposed from the resin encapsulant to function as external electrodes. A middle part of the die pad is formed at a higher level than a peripheral part thereof. This permits the formation of through holes in a thin part of the die pad. This enhances the degree of flexibility in the size of a semiconductor chip and the moisture resistance thereof.

19 Claims, 8 Drawing Sheets

FOREIGN PATENT DOCUMENTS

| | | |
|---|---|---|
| JP | 6-50360 | 7/1994 |
| JP | 07-161911 | 6/1995 |
| JP | 2000-243891 | 9/2000 |
| JP | 2001-077278 | 3/2001 |
| JP | 2002-100722 | 4/2002 |
| JP | 2002-134677 | 5/2002 |
| JP | 2003-17646 | 1/2003 |
| JP | 2003-086751 | 3/2003 |
| JP | 2003-204027 | 7/2003 |

OTHER PUBLICATIONS

Japanese Office Action, with English translation, issued in Japanese Patent Application No. JP 2005-137707, mailed Feb. 12, 2008.

Japanese Office Action, with English translation, issued in Japanese Patent Application No. JP 2005-137707, mailed Nov. 11, 2008.

* cited by examiner

LEAD FRAME AND RESIN-ENCAPSULATED SEMICONDUCTOR DEVICE

BACKGROUND OF THE INVENTION (1) Field of the Invention

The present invention relates to a resin-encapsulated semiconductor device in which a semiconductor chip and a lead frame are encapsulated with a resin encapsulant. In particular, the present invention relates to a resin-encapsulated semiconductor device with the back face of a die pad exposed to radiate heat from a power semiconductor element.

(2) Description of Related Art

In recent years, in response to downsizing of electronic units, it has become increasingly necessary to assemble semiconductor components for those electronic units at a higher and higher density. Correspondingly, sizes and thicknesses of the semiconductor components, such as resin-encapsulated semiconductor devices, in which a semiconductor chip and a lead frame are encapsulated with a resin encapsulant, have also been noticeably reduced. Examples of resin-encapsulated semiconductor devices accomplishing these objects include a so-called "quad flat non-leaded (QFN)" package. From the QFN package, outer leads, which are usually provided to protrude laterally out of a package, are eliminated. Instead, external electrodes to be electrically connected to a motherboard are provided on the back face of the QFN package.

A power semiconductor element produces a larger amount of heat than a normal semiconductor element. Therefore, when power semiconductor elements are built in a semiconductor chip, the resin-encapsulated semiconductor device should have its size or thickness reduced while its heat radiation properties are taken into account. Thus, a QFN package for a power semiconductor element (hereinafter, simply referred to as a "power QFN package") has intentionally exposed the back face of a die pad, on which a semiconductor chip is mounted, not covered with a resin encapsulant. Hereinafter, the structure and fabrication method of a known power QFN package will be described.

Figure 8A:
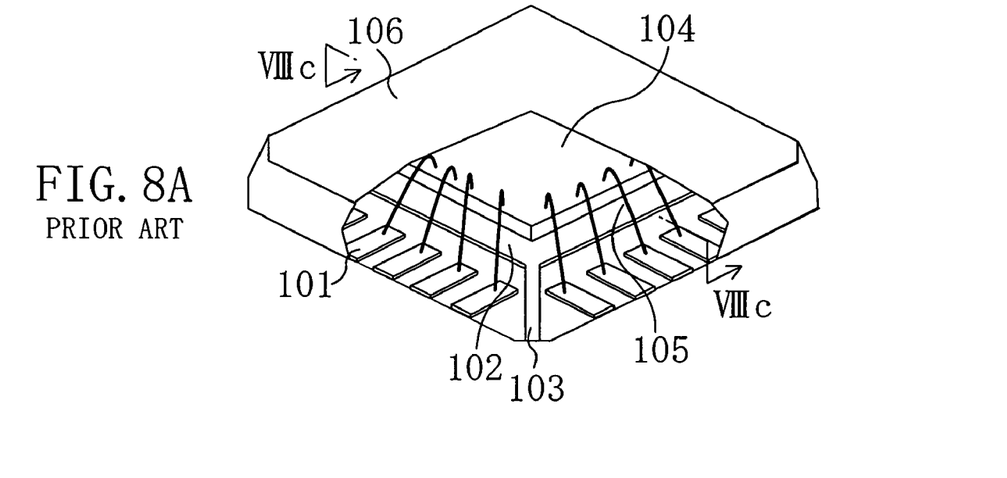
FIGS. 8A and 8B are perspective views illustrating a known power QFN package when seen from above and below, respectively.
Figure 8B:
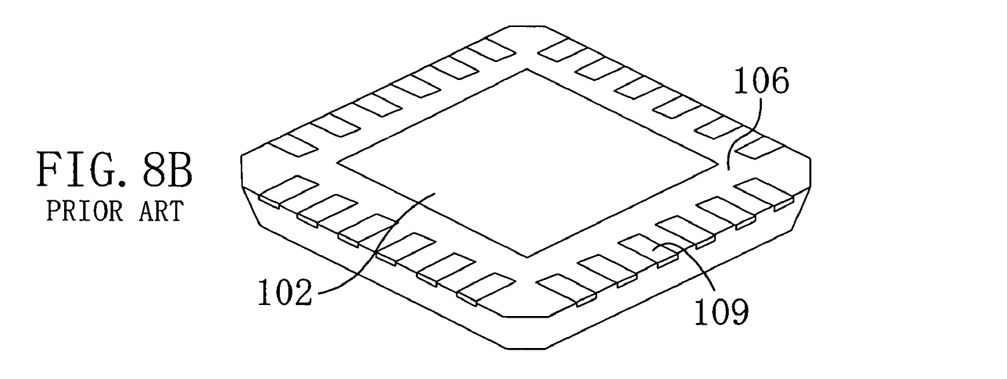
Figure 8C:
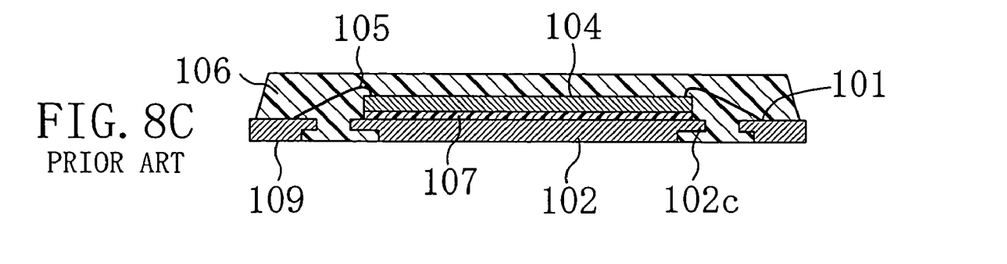
FIG. 8C is a cross-sectional view taken along the line VIIIc-VIIIc of the known power QFN package in FIG. 8A.

FIGS. 8A and 8B are perspective views of a known power QFN package when seen from above and below, respectively. FIG. 8C is a cross-sectional view taken along the line VIIIc-VIIIc of the known power QFN package in FIG. 8A.

As illustrated in FIGS. 8A through 8C, the known QFN package includes a die pad 102, a semiconductor chip 104 mounted on the top face of the die pad 102 and formed with an electrode pad and power semiconductor elements, a plurality of signal leads 101 provided around the die pad 102, support leads 103 for supporting the die pad 102, thin metal wires 105 through which the signal leads 101 or the die pad 102 are connected to an electrode pad (not shown) placed on the semiconductor chip 104, and a resin encapsulant 106 with which the top face of the die pad 102, the thin metal wires 105, the support leads 103, and the top faces of the signal leads 101 are encapsulated. The signal leads 101, the die pad 102, and the support leads 103 form a lead frame.

The semiconductor chip 104 is bonded, with an adhesive 107, onto the die pad 102 while its face on which power semiconductor elements are formed is oriented upward.

The above-mentioned members are encapsulated with the resin encapsulant 106 such that the back face of the die pad 102 and the back faces of the signal leads 101 are exposed. Since the back face of the die pad 102 is exposed, this allows the die pad 102 to function as a heat-radiating plate. By bringing the die pad 102 into contact with a heat-radiating portion of a motherboard, heat emitted from a power semiconductor element consuming a lot of power is dissipated to outside, thereby suppressing a rise in temperature within the package. The respective lower parts of the signal leads 101 including the exposed surfaces thereof are used as external electrodes 109.

According to a known power QFN package, the lower part of an outer edge portion of the die pad 102 is removed such that the outer edge portion thereof forms a thin part 102c. This allows the resin encapsulant 106 to reach under the thin part 102c. This can enhance the adhesion level between the die pad 102 and the resin encapsulant 106.

Such a power QFN package is formed, for example, in the following process steps.

First, a lead frame including the signal leads 101, die pad 102, support leads 103, and other components is prepared. It should be noted that the prepared lead frame is often provided with dam bars for preventing the overflow of a resin encapsulant during resin encapsulation.

Next, the back face of the semiconductor chip 104 is bonded, with the adhesive 108, onto the top face of the die pad 102 of the prepared lead frame. This process step is called "die bonding".

Then, an electrode pad of the semiconductor chip 104 mounted on the die pad 102 is electrically connected to the signal leads 101 or the die pad 102 through the thin metal wires 105. This process step is called "wire bonding". As the thin metal wires 105, thin aluminum (Al) or gold (Au) wires may be appropriately used.

Subsequently, the part of the die pad 102 other than the back face thereof, the semiconductor chip 104, the part of signal leads 101 other than the back faces thereof, the support leads 103, and the thin metal wires 105 are encapsulated with the resin encapsulant 106, such as an epoxy resin. In this case, the lead frame on which the semiconductor chip 104 has been mounted is introduced into a molding die assembly and transfer-molded.

Finally, respective outer end portions of the signal leads 101 protruding outward from the resin encapsulant 106 are cut off after the resin encapsulation. By performing this cutting process step, the resultant outer end faces of the signal leads 101 are substantially flush with the lateral side faces of the resin encapsulant 106. That is to say, this structure does not include any outer lead, which is ordinarily provided as an external terminal. Furthermore, the outer electrodes 109 and the back face of the die pad 102 which are exposed without being covered with a resin encapsulant are placed on the motherboard.

SUMMARY OF THE INVENTION

However, the known power QFN package illustrated in FIGS. 8A through 8C has the following drawbacks. Since the back face of the die pad 102 is exposed, this makes it difficult that only the formation of the thin part 102c prevents the adhesion level between the die pad 102 and the resin encapsulant 106 from being reduced. Separation of the die pad 102 from the resin encapsulant 106 may cause separation of the thin metal wires 105 connected to the die pad 102 from the die pad 102, leading to a malfunction in the power QFN package. In a case where the two-dimensional size of the semiconductor chip 104 is smaller than that of the top or back face of the die pad 102, the adhesion level between the resin encapsulant 106 and the die pad 102 can be improved by forming slits (linear grooves) and through holes in an outer edge portion of the die pad 102.

However, in an increasing number of cases, in order to reduce the size of a package, the semiconductor chip 104 is allowed to have a larger size than the die pad 102. If in this case the two-dimensional size of the semiconductor chip 104 is larger than that of the die pad 102, this will make it impossible to form through holes in the thin part 102c of the die pad 102 and form slits in the top face of the thin part 102c. In view of the above, in order to ensure the reliability of the operation of the known power QFN package, the size of the semiconductor chip 104 that can be mounted on the die pad 102 has been inevitably restricted.

With the structure of the known QFN package, after resin encapsulation, a stress resulting from deformation of a resin encapsulant passes through support leads and reaches a die pad, leading to separation of the die pad from the resin encapsulant. This may impair the reliability of the QFN package.

An object of the present invention is to provide a resin-encapsulated semiconductor device which is provided with a portion for preventing separation of a die pad from a resin encapsulant and on which semiconductor chips of various sizes can be placed.

A lead frame of the present invention for use in the packaging of a semiconductor chip includes: a framework; a die pad placed in the framework and having a middle part and a peripheral part surrounding the middle part; a plurality of signal leads placed around the die pad and connected to the framework; and a plurality of support leads for supporting the die pad, wherein the top face of the middle part is formed at a higher level than the top face of the peripheral part, and an outer edge portion of the peripheral part is formed with a thin part which forms part of the upper part of the die pad projecting laterally beyond the lower part thereof and is formed with a to-be-filled portion.

With this structure, the thin part of the die pad is formed with a to-be-filled portion to be filled with a resin encapsulant. Therefore, a resin encapsulation process step and other process steps are undergone after the packaging of the semiconductor chip on the lead frame of the present invention, thereby fabricating a resin-encapsulated semiconductor device with enhanced adhesion level between the die pad and the resin encapsulant. In view of the above, the use of the lead frame of the present invention permits the achievement of a high-reliability semiconductor device which restrains the resin encapsulant from being separated from the die pad and provides enhanced moisture resistance.

The to-be-filled portion may be, for example, a through hole or a groove, such as a slit, formed in the thin part. Alternatively, it may be a recess formed in the outer edge of the thin part.

In the lead frame of the present invention, the lower part of the die pad may form a rectangular planar shape and the upper part thereof may form the shape of an n-gon (where n is an integer of 4 or more) whose corner portions are placed apart from corner portions of the lower part of the die pad or a circle. Therefore, in a resin-encapsulated semiconductor device fabricated using the lead frame, stresses applied to corner portions of the die pad can be distributed.

Furthermore, the top face of part of the die pad to which each said support lead may be connected is formed with a groove. Therefore, in a resin-encapsulated semiconductor device fabricated using the lead frame of the present invention, the stress applied from each support lead is separated from the stress applied from the die pad by the groove.

A resin-encapsulated semiconductor device of the present invention includes: a die pad; a semiconductor chip formed with an electrode pad and a semiconductor element; a plurality of signal leads placed around the die pad and extending toward the die pad; a plurality of connection members through which the electrode pad is connected to the signal leads; a plurality of support leads for supporting the die pad; and a resin encapsulant with which the top face of the die pad, the connection members, the support leads, and the top face of the signal leads are encapsulated with the back face of the die pad and the back faces of the signal leads exposed, wherein the top face of a middle part of the die pad is formed at a higher level than the top face of a peripheral part of the die pad surrounding the middle part, the semiconductor chip is placed on the top face of the middle part of the die pad, and an outer edge portion of the peripheral part is formed with a thin part which forms part of the upper part of the die pad projecting laterally beyond the lower part thereof and is formed with a to-be-filled portion filled with the resin encapsulant.

In this way, the to-be-filled portion is filled with the resin encapsulant, thereby enhancing the adhesion level between the die pad and the resin encapsulant. This can prevent the occurrence of problems, such as separation of the resin encapsulant from the die pad and breaks in the connection members, and provide a high-reliability resin-encapsulated semiconductor device exhibiting enhanced moisture resistance. Since the back face of the die pad is exposed, this permits the release of heat from the exposed back face thereof. Therefore, elements producing a large amount of heat, such as power semiconductor elements, may be placed on the semiconductor chip.

The to-be-filled portion may be, for example, a through hole, a groove, or a slit formed in the thin part. Alternatively, it may be a recess formed in the outer edge of the thin part.

The to-be-filled portion and the semiconductor chip may overlap each other when viewed in plane. This can enhance the degree of flexibility in the size of the semiconductor chip.

A groove may be further formed in the top face of part of the peripheral part other than the thin part.

In the resin-encapsulated semiconductor device of the present invention, the lower part of the die pad may form a rectangular planar shape and the upper part thereof may form the shape of an n-gon (where n is an integer of 4 or more) whose corner portions are placed apart from corner portions of the lower part of the die pad or a circle. This permits the distribution of the stresses concentrated at corner portions of the die pad. In particular, the upper part of the die pad preferably forms an octagonal shape. This facilitates the fabrication of the resin-encapsulated semiconductor device.

The top face of part of the die pad to which each said support lead is connected may be formed with a groove.

DETAILED DESCRIPTION OF THE INVENTION

In the following embodiments, the structure of a power QFN package into which power elements are built as a resin-encapsulated semiconductor device when the present invention is applied to the power QFN package will be described as an example.

Embodiment 1

Structure of Power QFN Package

Figure 1A:
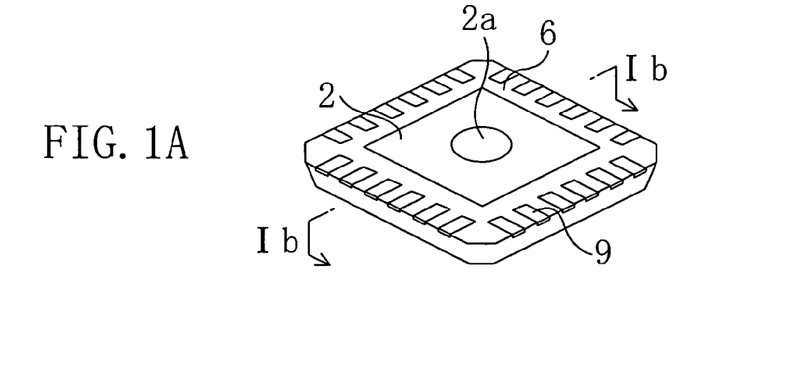
FIG. 1A is a perspective view illustrating the back face of a power QFN package according to a first embodiment of the present invention.
Figure 1B:
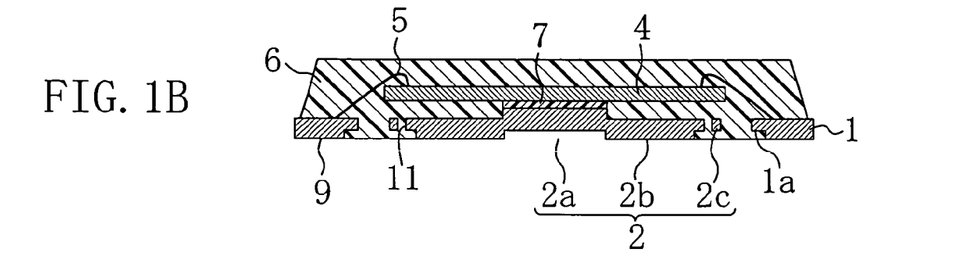
FIG. 1B is a cross-sectional view taken along the line Ib-Ib of the power QFN package in FIG. 1A.
Figure 1C:
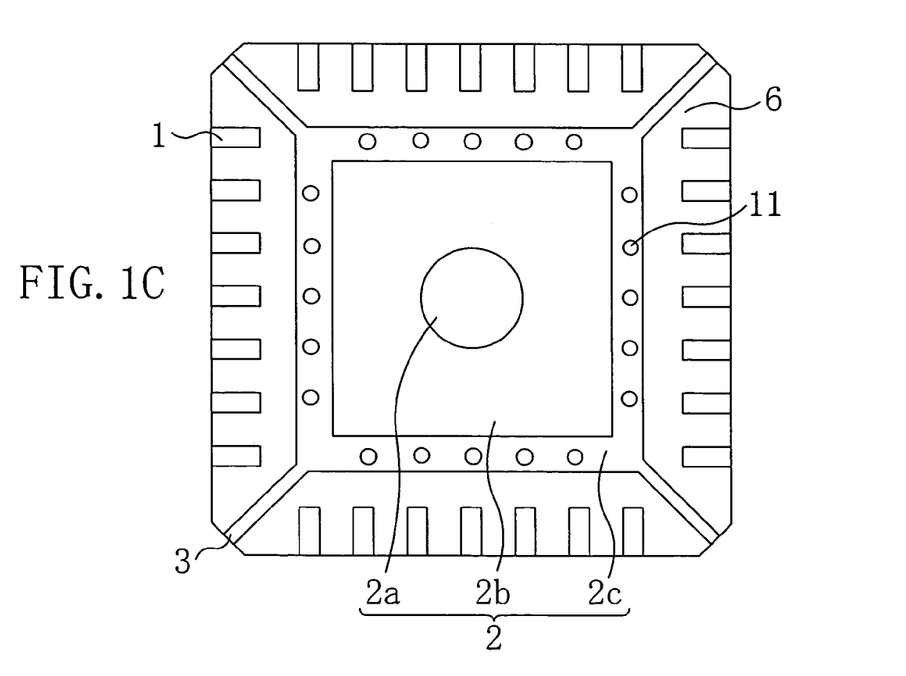
FIG. 1C is a plan view of the power QFN package in FIG. 1A when seen from below.

FIG. 1A is a perspective view illustrating the back face of a power QFN package according to a first embodiment of the present invention. FIG. 1B is a cross-sectional view taken along the line Ib-Ib of the power QFN package in FIG. 1A. FIG. 1C is a plan view illustrating the power QFN package of this embodiment when seen from the back face thereof. In FIG. 1C, to help the understanding of the power QFN package, a resin encapsulant 6 is treated as a transparent object. Furthermore, the vertical direction in the following description is based on that in FIG. 1B.

As illustrated in FIGS. 1A through 1C, the power QFN package of this embodiment includes a die pad 2, a semiconductor chip 4 mounted on the top face of part of the die pad 2 and formed with an electrode pad and a power semiconductor element, a plurality of signal leads 1 provided around the die pad 2 and extending toward the die pad 2, support leads 3 for supporting the die pad 2, thin metal wires (connection members) 5 through which the signal leads 1 or the die pad 2 are connected to an electrode pad (not shown) placed on the semiconductor chip 4, and a resin encapsulant 6 with which the top face of the die pad 2, the thin metal wires 5, the support leads 3, and the top faces of the signal leads 1 are encapsulated. As long as the semiconductor chip 4 is small enough not to overlap with each signal lead 1, the two-dimensional size of the semiconductor chip 4 may be larger or smaller than that of the die pad 2. The electrode pad placed on the semiconductor chip 4 and the die pad 2 are connected to each other only when the two-dimensional size of the semiconductor chip 4 is smaller than that of the die pad 2.

The signal leads 1, the die pad 2, and the support leads 3 are members forming a lead frame. The signal leads 1 serve as paths through which electrical signals including a power supply voltage and a ground voltage are transmitted. The die pad 2 includes a middle part 2a forming, for example, a circular shape when viewed in plane and a peripheral part 2b surrounding the middle part 2a. An outer edge portion of the peripheral part 2b is formed with a thin part 2c which is reduced in thickness by partly removing the lower part of the peripheral part 2b. In other words, the upper part of the die pad 2 including the thin part 2c projects laterally beyond the lower part thereof. Although in FIG. 1C the die pad 2 forms a generally rectangular shape when viewed in plane, it may form any other shape. The end of each signal lead 1 closer to the die pad 2 is formed with a thin part 1a which is reduced in thickness by partly removing the lower part thereof.

The above-mentioned members are encapsulated with the resin encapsulant 6 to expose the back face of the die pad 2 and the back faces of the signal leads 1. Since the back face of the die pad 2 is exposed, this allows the die pad 2 to function as a heat-radiating plate. By bringing the die pad 2 into contact with a heat-radiating portion of a motherboard, heat emitted from a power semiconductor element consuming a lot of power is dissipated to outside, thereby suppressing a rise in temperature within the package. The respective lower parts of the signal leads 1 including the exposed surfaces thereof are used as external electrodes 9. The package is, for example, in the shape of a generally cuboid. The two-dimensional size of the whole package is not particularly limited but may be 3 to 10 mm per side both inclusive.

The power QFN package of this embodiment is characterized in that the middle part 2a of the die pad 2 is formed at a higher level than the other part thereof (peripheral part 2b) by a half blanking presswork or other processes. The half blanking presswork will be described later. A part of the thin part 2c of the die pad 2 overlapping with the semiconductor chip 4 when viewed in plane is formed with a plurality of through holes 11. As illustrated in FIG. 1C, the through holes 11 are formed, for example, around the die pad 2. The die pad 2 has a thickness of, for example, 0.2 mm, and each through hole 11 has a diameter of, for example, approximately 0.2 mm.

The semiconductor chip 4 is bonded, with an adhesive 7, onto the die pad 2 while its face on which power semiconductor elements are formed is oriented upward. Since in the power QFN package of this embodiment the top face of the middle part 2a is formed at a higher level than the top face of the peripheral part 2b, the through holes 11 can be formed in the part of the thin part 2c of the die pad 2 overlapping with the semiconductor chip 4. Therefore, in the power QFN package of this embodiment, an anchor effect is exhibited by allowing the resin encapsulant 6 to enter into the through holes 11, resulting in the enhanced adhesion level between the die pad 2 and the resin encapsulant 6. This can prevent the thin metal wires 5 from being separated from the die pad 2. Unlike the known QFN package in which a semiconductor chip is bonded onto the whole top face of a die pad, a space between the semiconductor chip 4 and the peripheral part 2b of the die pad 2 is filled with the resin encapsulant 6. Therefore, the semiconductor chip 4 can be supported by the resin encapsulant 6 with reliability. This can prevent moisture from entering from the back face (lower face side) of the package. In view of the above, in the QFN package of this embodiment, it is less likely to produce cracks in the package unlike the known QFN package.

Even when the size of the semiconductor chip 4 is larger than that of the die pad 2, through holes 11 can be formed in the thin part 2c of the die pad 2, leading to the enhanced moisture resistance.

Since in the QFN package of this embodiment through holes 11 are formed in the thin part 2c of the die pad 2, this can further enhance the adhesion level between the resin encapsulant 6 and the die pad 2, which has been enhanced only by forming the thin part 2c. In the QFN package of this embodiment, the moisture resistance is improved and failures in connection are reduced. In view of the above, the reliability of the QFN package of this embodiment is enhanced as compared with the known QFN package.

In the QFN package of this embodiment illustrated in FIGS. 1A through 1C, the through holes 11 are formed in the part of the thin part 2c of the die pad 2 overlapping with the semiconductor chip 4 when viewed in plane. However, through holes 11 may be formed in any part of the thin part 2c. Also in cases where the top face of the peripheral part 2b is formed with not the through holes 11 but slits or the outer edge of the die pad 2 is formed with unevenness as described below, the same effects as provided by the through holes 11 can be achieved. In other words, the peripheral part 2b of the die pad 2 is formed is formed with a portion to be filled with the resin encapsulant 6 (hereinafter, referred to as "to-be-filled portion"), which enhances the adhesion level between the resin encapsulant 6 and the die pad 2. The shape of the to-be-filled portion is not particularly limited as long as the portion forms any shape that increases the surface area of the die pad 2, such as through holes, grooves including slits and annular grooves, or projections and depressions formed at the outer edge of the die pad 2.

The planar shape of the middle part 2a formed at a higher level than the peripheral part 2b is not limited to a circle.

In the example illustrated in FIGS. 1A through 1C, an electrode pad placed on a semiconductor chip 4 is connected through thin metal wires 5 to signal leads 1 or a die pad 2. However, the semiconductor chip 4 may be bonded onto a middle part 2a of the die pad 2 while the face of the semiconductor chip 4 on which power semiconductor elements are formed is oriented toward the top face of the middle part 2a of the die pad 2, and an electrode pad may be connected to the die pad 2 through metal bumps placed on a peripheral part 2b of the die pad 2. Metal bumps may be used to connect the signal leads 1 to the electrode pad. In the above-mentioned case, the height of each metal bump placed on the peripheral part 2b of the die pad 2 needs to be equal to or larger than the sum of the level difference between the middle part 2a and the peripheral part 2b and the thickness of the adhesive 7.

—Fabrication Method for Power QFN Package—

Next, a fabrication method for a power QFN package of this embodiment will be described.

Figure 2A:
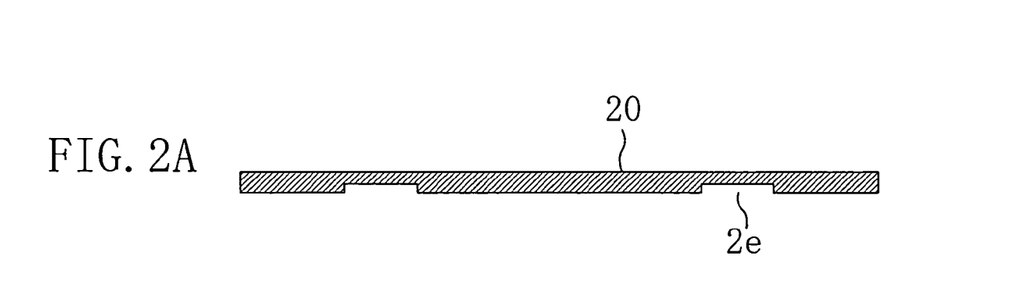
FIGS. 2A through 2C are diagrams illustrating process steps in a processing method for a lead frame in use for the power QFN package according to the first embodiment.
Figure 2B:
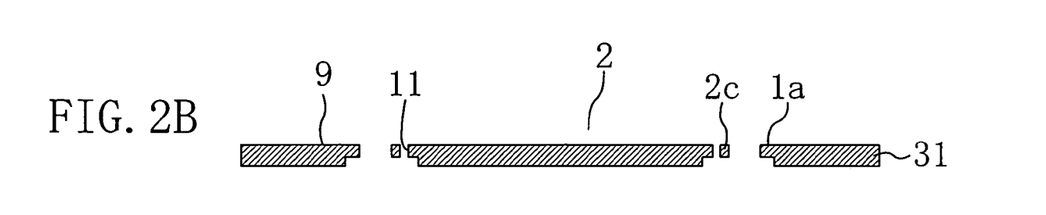
Figure 2C:
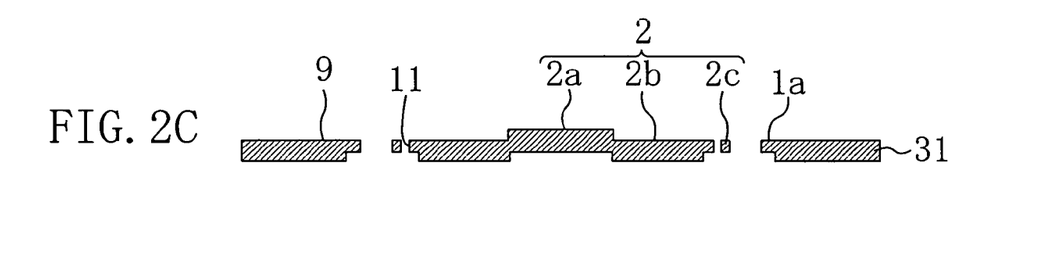

FIGS. 2A through 2C are diagrams illustrating a processing method for a lead frame used for the power QFN package of this embodiment. FIGS. 3A through 4C are cross-sectional views illustrating process steps for forming a package in a fabrication method for the power QFN package of this embodiment.

First, as illustrated in FIG. 2A, an approximately 0.2-mm-thick plate-like lead frame 20 made of copper or any other material is prepared. Subsequently, the lower part of the lead frame 20 is partly removed by wet etching, thereby forming a rectangular band-like groove (by half etching). In FIG. 2A, a part of the lead frame 20 formed with this groove and reduced in thickness is illustrated as a thin part 2e. The lead frame 20 may be made of iron or nickel.

Next, as illustrated in FIG. 2B, the lead frame 20 is partly etched to pass through the lead frame 20, thereby forming a generally rectangular die pad 2, a plurality of leads 31 and support leads 3 (not shown). In this process step, the thin part 2e is formed into thin parts 1a of the leads 31 and a thin part 2c of the die pad 2. In this case, approximately 0.2-mm-diameter through holes 11 are formed in the thin part 2c.

Subsequently, as illustrated in FIG. 2C, the die pad 2 is processed by a half blanking presswork such that a circular middle part 2a of the die pad 2 is located at a higher level than part thereof around the middle part 2a (peripheral part 2b). In this half blanking presswork step, a pressing process for stamping a middle circular part of the die pad 2 of the lead frame 20 is stopped in progress so that the circular part is partly joined to the lead frame 20 while being stamped partway. A level difference is formed between the middle part 2a and the peripheral part 2b at each of the top and back faces of the die pad 2 due to the upward pressure produced by the presswork. In this process step, the middle part 2a of the die pad 2 can be located at a higher level than the peripheral part 2b thereof and the leads 31 by half etching instead of the half blanking presswork. In this case, parts of the upper part of the lead frame 20 that will be the peripheral part 2b of the die pad 2 and the leads 31 are removed, and a part of the lower part thereof that will be the middle part 2a of the die pad 2 is removed. This allows formation of a thinner resin-encapsulated semiconductor device. In the above-mentioned process steps, the lead frame 20 is processed. In this stage, the leads 31 remains joined to a framework (not shown).

Figure 3A:
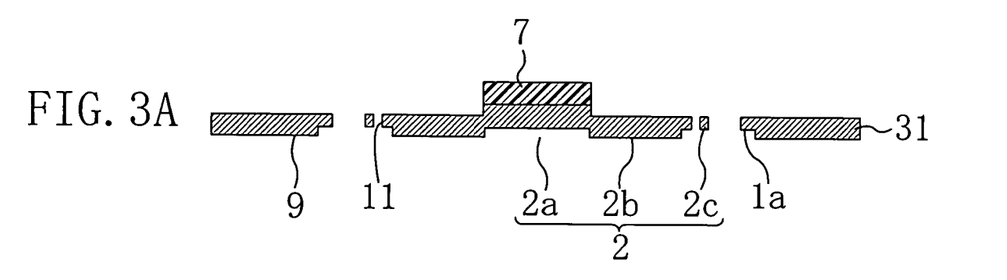
FIGS. 3A through 3C are cross-sectional views illustrating some of process steps for forming a package in a fabrication process for the power QFN package according to the first embodiment.
Figure 3B:
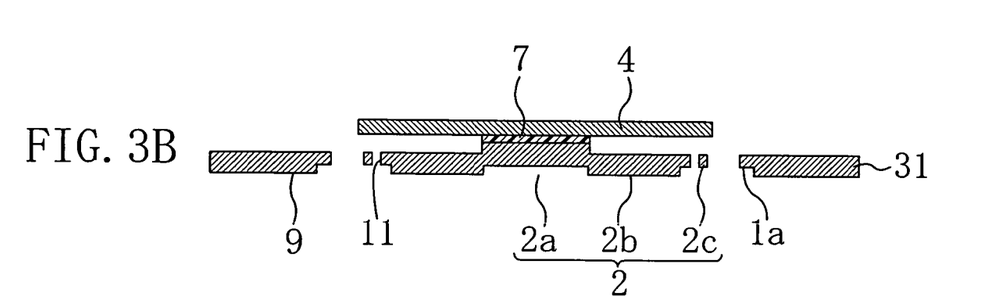

Next, as illustrated in FIG. 3A, a paste-like adhesive 7 is applied to the top face of the middle part 2a of the die pad 2. Thereafter, as illustrated in FIG. 3B, a semiconductor chip 4 is bonded onto the middle part 2a by the adhesive 7 while its face on which elements are formed is oriented upward. The semiconductor chip 4 only needs to be small enough not to overlap with the leads 31 when viewed in plane. The semiconductor chip 4 may be formed with power semiconductor elements or an electrode pad connected to such elements or may be formed with semiconductor elements other than the power semiconductor elements.

Figure 3C:
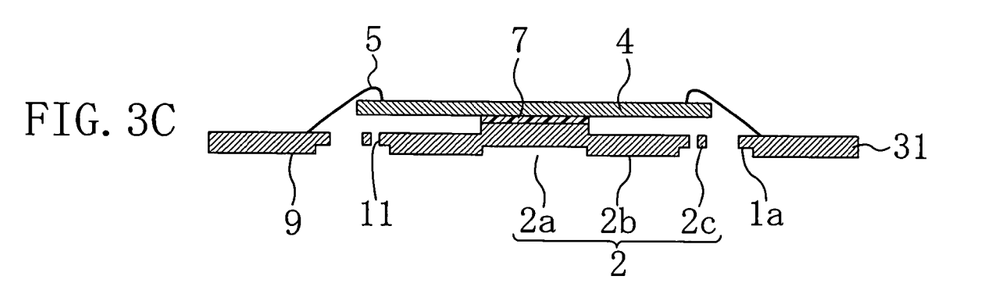

Subsequently, as illustrated in FIG. 3C, thin metal wires 5 are formed to allow connection between the leads 31 and the electrode pad placed on the semiconductor chip 4. In a case where the outer edge of the semiconductor chip 4 is located inside the outer edge of the die pad 2, the die pad 2 and the electrode pad are connected through the thin metal wires 5 to each other.

Figure 4A:
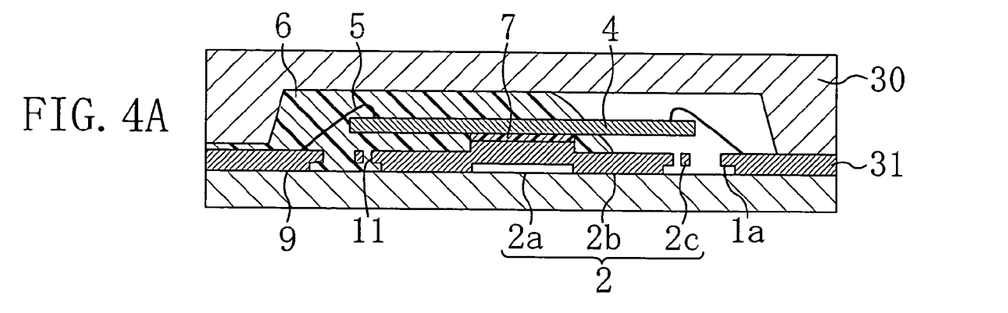
FIGS. 4A through 4C are cross-sectional views illustrating the other ones of the process steps for forming a package in a fabrication process for the power QFN package according to the first embodiment.

Next, as illustrated in FIG. 4A, the lead frame 20 is enclosed with a molding die 30 such that the semiconductor chip 4, the die pad 2, the leads 31, and other components are located inside a cavity of the molding die 30. In this state, a liquid resin encapsulant 6 (for example, epoxy resin) is injected into the cavity through a port through which a resin is injected thereinto, and the cavity is filled with a resin. If through holes 11 were formed in the part of the die pad 2 other than the thin part 2c thereof, the resin encapsulant 6 would reach the back face of the lead frame 20 in this process step. Therefore, through holes 11 needs to be formed in the thin part 2c.

Figure 4B:
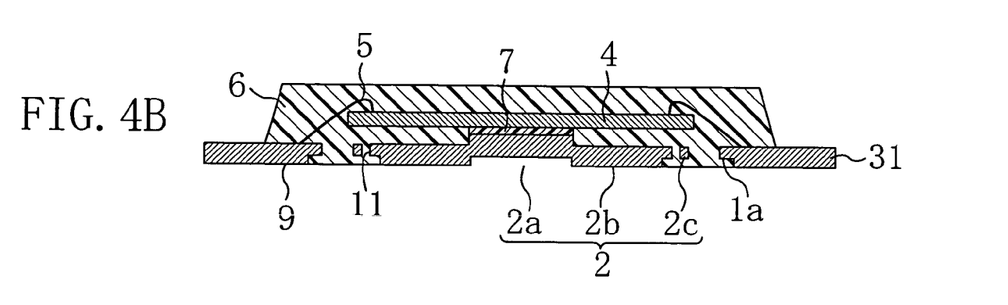

Subsequently, as illustrated in FIG. 4B, the molding die 30 is removed after the solidification of the resin encapsulant 6. Since the through holes 11 are also filled with the resin encapsulant 6, the adhesion level between the resin encapsulant 6 and the die pad 2 is enhanced as compared with the known QFN package. The lower faces of the middle part 2a and peripheral part 2b of the die pad 2 and the lower faces of the leads 31 are exposed without being encapsulated with a resin.

Figure 4C:
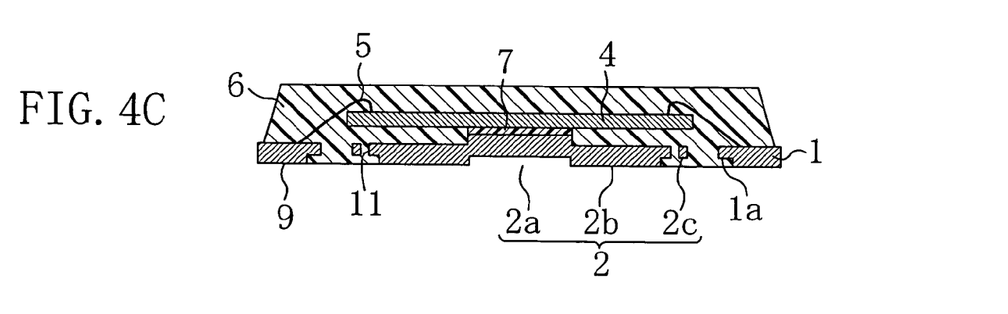

Next, as illustrated in FIG. 4C, respective parts of the leads 31 located outside the resin encapsulant 6 are cut away, and the resin-encapsulated semiconductor device is separated from a framework for the lead frame 20. In this way, signal leads 1 are formed such that their lateral ends are substantially flush with the lateral sides of the resin encapsulant 6. The lower faces of the signal leads 1 serve as external electrodes 9. In the above-mentioned manner, a power QFN package of this embodiment can be fabricated.

According to the fabrication method for the power QFN package of this embodiment, through holes 11 can be formed simultaneously with the formation of leads 31 and a die pad 2. This can provide a high-reliability resin-encapsulated semiconductor device at the same cost as the known power QFN package.

Embodiment 2

Figure 5A:
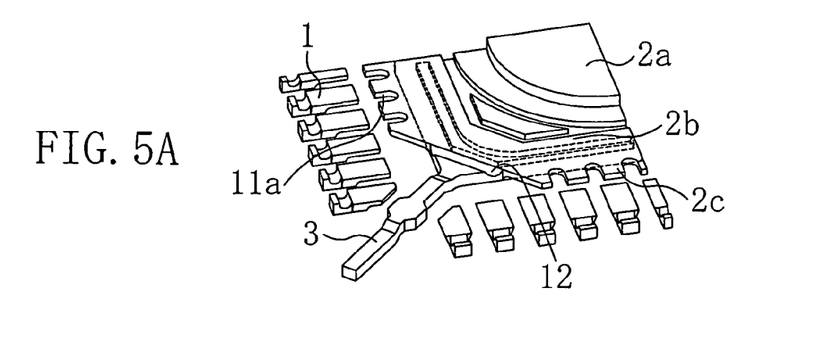
FIG. 5A is an enlarged perspective view illustrating a part of a lead frame of a power QFN package according to a second embodiment of the present invention.
Figure 5B:
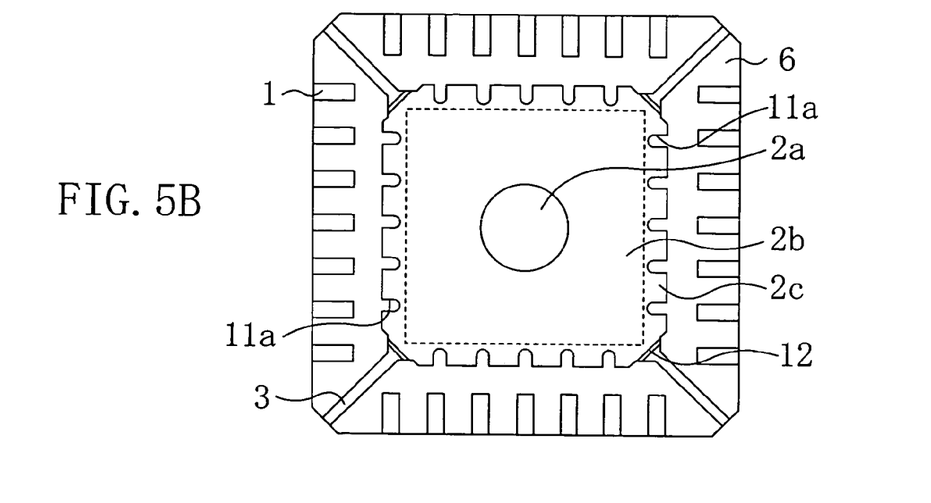
FIG. 5B is a plan view illustrating the power QFN package in FIG. 5A when seen from above.
Figure 5C:
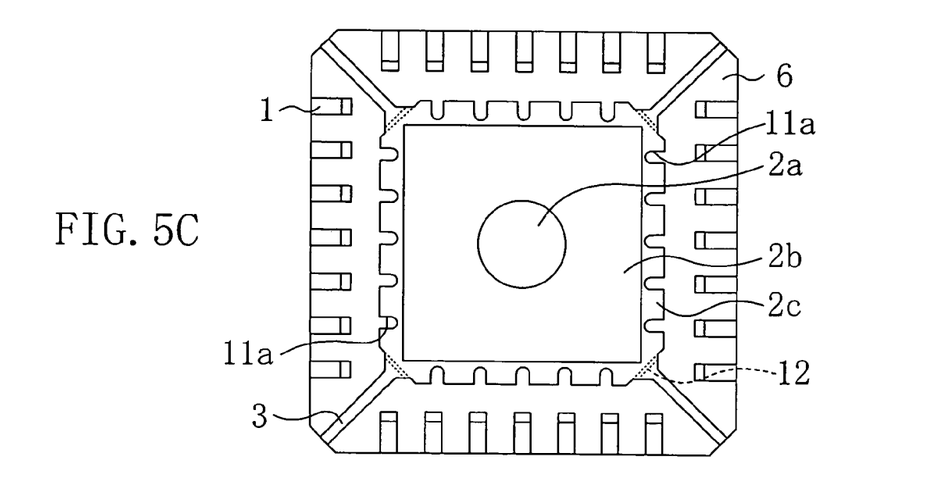
FIG. 5C is a plan view illustrating the power QFN package in FIG. 5A when seen from below.

A resin-encapsulated semiconductor device according to a second embodiment of the present invention will be described. FIG. 5A is an enlarged perspective view illustrating a part of a lead frame of a power QFN package according to the second embodiment. FIG. 5B is a plan view illustrating the power QFN package of this embodiment when seen from above. FIG. 5C is a plan view illustrating the power QFN package of this embodiment when seen from below. In FIGS. 5B and 5C, to help the understanding of the structure of the power QFN package, a semiconductor chip 4 and a resin encapsulant 6 are treated as transparent objects. A detailed description of the same components as in the first embodiment is not given.

As illustrated in FIGS. 5A through 5C, the power QFN package of this embodiment includes a die pad 2, a semiconductor chip 4 (not shown) mounted on the top face of part of the die pad 2 and formed with an electrode pad and power semiconductor elements, a plurality of signal leads 1 provided around the die pad 2, support leads 3 for supporting the die pad 2, thin metal wires 5 through which the signal leads 1 or the die pad 2 are connected to an electrode pad (not shown) placed on the semiconductor chip 4, and a resin encapsulant 6 with which the top face of the die pad 2, the thin metal wires 5 (not shown), the support leads 3, and the top faces of the signal leads 1 are encapsulated.

A first characteristic of the power QFN package of this embodiment is that an outer edge portion of a peripheral part 2b of the die pad 2 is formed with a thin part 2c and the outer edge of the thin part 2c is formed with recesses 11a.

Therefore, in the power QFN package of this embodiment, an anchor effect is exhibited by allowing the resin encapsulant 6 to enter into the recesses 11a formed in the thin part 2c, resulting in the more effectively enhanced adhesion level between the die pad 2 and the resin encapsulant 6. As a result, it is less likely that moisture will enter from the back face of the package, resulting in the suppressed production of cracks. Furthermore, it is less likely that the resin encapsulant 6 will be separated from the die pad 2. This allows prevention of breaks in the thin metal wires 5. The adhesion level between the resin encapsulant 6 and the die pad 2 is enhanced with an increase in the number of recesses Ha formed in the outer edge of the die pad 2. However, the number of recesses 11a is not particularly limited.

A second characteristic of the power QFN package of this embodiment is that while the lower part of the die pad 2 forms a generally rectangular planar shape as in the first embodiment, the upper part of the die pad 2 forms a generally octagonal planar shape. More particularly, the upper part of the die pad 2 forms an octagonal planar shape obtained by cutting away corner portions of the upper part of a rectangular die pad 2. Furthermore, as illustrated in FIG. 5A, approximately 0.2-mm-wide grooves 12 are formed in the top faces of parts of the die pad 2 to which the support leads 3 are connected, respectively. Each groove 12 extends in a direction that crosses or is orthogonal to the direction in which the corresponding support lead 3 extends. In the example illustrated in FIG. 5A, the grooves 12 are formed along four edges among eight edges of the octagon forming the upper part of the die pad 2, respectively. However, since the upper part of the die pad 2 is encapsulated with the resin encapsulant 6, the back face of the power QFN package of this embodiment has the same shape as that of the known QFN package.

In a case where the whole die pad 2 forms a rectangular planar shape, such as a square, the resin encapsulant 6 usually becomes deformed after the resin encapsulation, resulting in stress concentrated at the corner portions of the die pad 2. On the other hand, since in the power QFN package of this embodiment the upper part of the die pad 2 forms a generally octagonal shape, the stress applied to the corner portions of the die pad 2 can be distributed. This can prevent separation of the die pad 2 from the resin encapsulant 6 and breaks in the thin metal wires 5. Furthermore, since grooves 12 are formed in the parts of the die pad 2 to which the support leads 3 are connected, the stress applied from each support lead 3 can be separated from the stress applied from the die pad 2 by the associated groove 12. This can prevent strong stress from being applied to the support lead 3 and the die pad 2.

The lead frame of this embodiment and the power QFN package using the lead frame can be fabricated without increasing the number of process steps as compared with the lead frame of the first embodiment and the power QFN package using the lead frame thereof.

More particularly, in a half etching process step illustrated in FIG. 2A, the lower part of the lead frame 20 is partly removed such that the lower part of the die pad 2 becomes rectangular, thereby forming a thin part 2e like the first embodiment. Thereafter, in an etching process step illustrated in FIG. 2B, the lead frame 20 is wet-etched such that the upper part of the die pad 2 forms an octagonal shape, and recesses 11a are formed in the outer edge of the die pad 2. In this process step, in order to form the die pad 2, part of the lead frame 20 to be etched need only be changed from that of the first embodiment. Therefore, the lead frame of this embodiment can be fabricated with the same number of process steps as in the first embodiment. Thereafter, the power QFN package of this embodiment can be fabricated by carrying out the process steps illustrated in FIGS. 2C and 3A through 4C like the first embodiment.

Although in the power QFN package of this embodiment the lower part of the die pad 2 forms a rectangular planar shape and the upper part thereof forms a octagonal planar shape, the upper part thereof need only form the shape of an n-gon (where n is an integer of 4 or more) or a circle which prevents the corner portions of the lower part of the die pad 2 from overlapping with (being placed apart from) the corner portions of the upper part thereof when viewed in plane. However, in terms of ease of process steps for fabricating a power QFN package, it is most preferable that the lower part of the die pad 2 forms a rectangular shape and the upper part thereof forms an octagonal shape.

The QFN package of this embodiment can be applied to a semiconductor chip on which elements other than power semiconductor elements are placed and which produces a relatively small amount of heat.

Embodiment 3

A power QFN package obtained by changing the power QFN package of the second embodiment in the shape of a to-be-filled portion of a die pad to be filled with a resin encapsulant will be described below as an example of a resin-encapsulated semiconductor device according to a third embodiment of the present invention.

Figure 6:
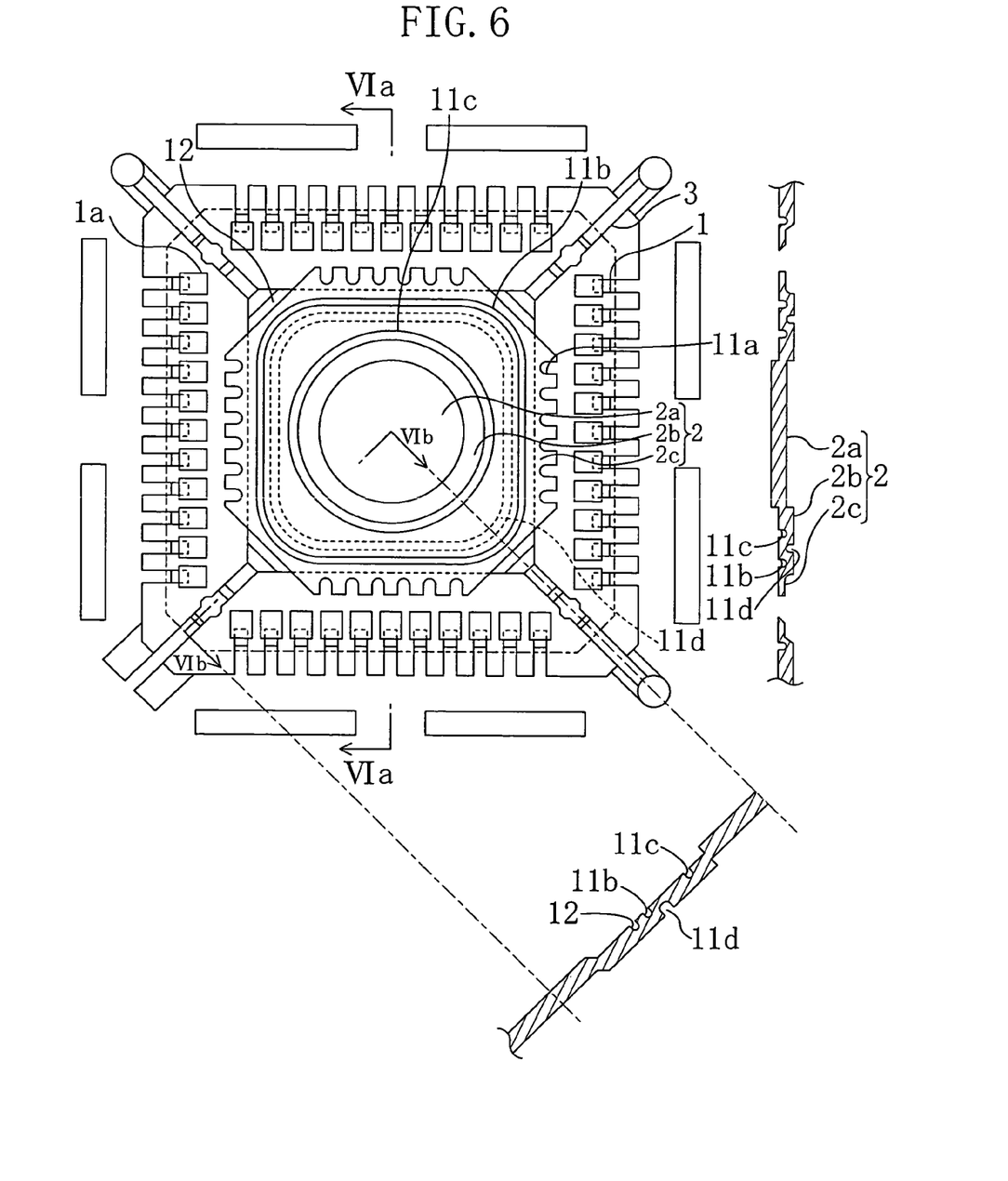
FIG. 6 is a plan view illustrating a lead frame of a power QFN package according to a third embodiment when seen from above.

FIG. 6 is a plan view illustrating a lead frame of a power QFN package according to the third embodiment when seen from above. Illustrated in the lower right portion of the plan view of FIG. 6 is a cross-sectional view of the lead frame taken along the line (VIb-VIb) with which the center of a die pad and a support lead are connected. Illustrated to the right side of the plan view is a cross-sectional view of the lead frame taken along the line (VIa-VIa) with which the respective centers of two opposed edges of the die pad are connected. The appearance of the power QFN package of this embodiment is similar to that of the power QFN package of each of the first and second embodiments. Therefore, the power QFN package of this embodiment is not illustrated.

As illustrated in FIG. 6, the shapes of signal leads 1 and support leads 3 of the power QFN package of this embodiment are identical with those of the second embodiment.

The power QFN package of this embodiment is different from that of the second embodiment in that grooves 11b and 11c are formed, as to-be-filled portions of a die pad 2 to be filled with a resin encapsulant 6, in the top face of a peripheral part 2b of the die pad 2, a groove 11d is formed, as another to-be-filled portion thereof, in the back face thereof and the grooves 11b, 11c and 11d surround a middle part 2a of the die pad 2 to form a ring shape. The grooves 11b, 11c and 11d may form an annular shape as illustrated in FIG. 6 or partly discontinuous slits.

The grooves 11b, 11c and 11d may be formed in not only a thin part 2c of the die pad 2 but also the other part thereof unlike the through holes 11 (see FIG. 1) and the recesses 11a (see FIG. 5). When any groove is formed in the thin part 2c, the thickness of part of the die pad 2 formed with the groove must be prevented from becoming too thin. The width of each groove 11b, 11c or 11d is not particularly limited. However, in order to maintain the strength of the die pad 2, the width thereof is preferably 0.2 mm or less.

Since in the power QFN package of this embodiment the top face of the middle part 2a of the die pad 2 becomes higher in level than the top face of the peripheral part 2b thereof, grooves forming various shapes, such as slits or annular grooves, can be formed in the top or back face of the peripheral part 2b as described above. Thus, in the power QFN package of this embodiment, the entry of the resin encapsulant 6 into such grooves enhances the adhesion level between the die pad 2 and the resin encapsulant 6. This can prevent the resin encapsulant 6 from being separated from the die pad 2, resulting in prevention of breaks in thin metal wires 5. The moisture resistance of the power QFN package of this embodiment is improved as compared with the known power QFN package.

The grooves, such as the grooves 11b, 11c and 11d, are formed together with recesses and through holes formed in the thin part 2c. This can further enhance the adhesion level between the die pad 2 and the resin encapsulant 6.

Furthermore, in the power QFN package of this embodiment, the lower part of the die pad 2 forms a rectangular shape and the upper part thereof forms an octagonal shape in which its corner portions are placed apart from corner portions of the lower part thereof. This permits the distribution of the stress applied to the corner portions of the die pad 2. Grooves 12 are formed in parts of the die pad 2 to which the support leads 3 are connected. Therefore, the stresses applied from the support leads 3 are separated from the stress applied from the die pad 2 by the grooves 12. This can prevent strong stress from being applied to the support leads 3 and the die pad 2.

The size of a semiconductor chip 4 placed on the top face of the middle part 2a is not particularly limited as long as the semiconductor chip 4 is small enough not to overlap with the signal leads 1 when viewed in plane. Since in the power QFN package of this embodiment the middle part 2a is formed at a higher level than the peripheral part 2b, slits and grooves can be formed in the top face of the die pad 2 regardless of the size of the semiconductor chip 4.

The above-described power QFN package of this embodiment is fabricated by substantially the same process steps as those illustrated in FIGS. 2A through 4C. However, in the process step illustrated in FIG. 2A, the upper or lower part of the lead frame 20 is formed with grooves, and in the process step illustrated in FIG. 2B, the upper part of the die pad 2 is etched to form an octagonal shape. In view of the above, the power QFN package of this embodiment can be fabricated without increasing the number of process steps as compared with the power QFN package of each of the first and second embodiment.

Embodiment 4

Figure 7A:
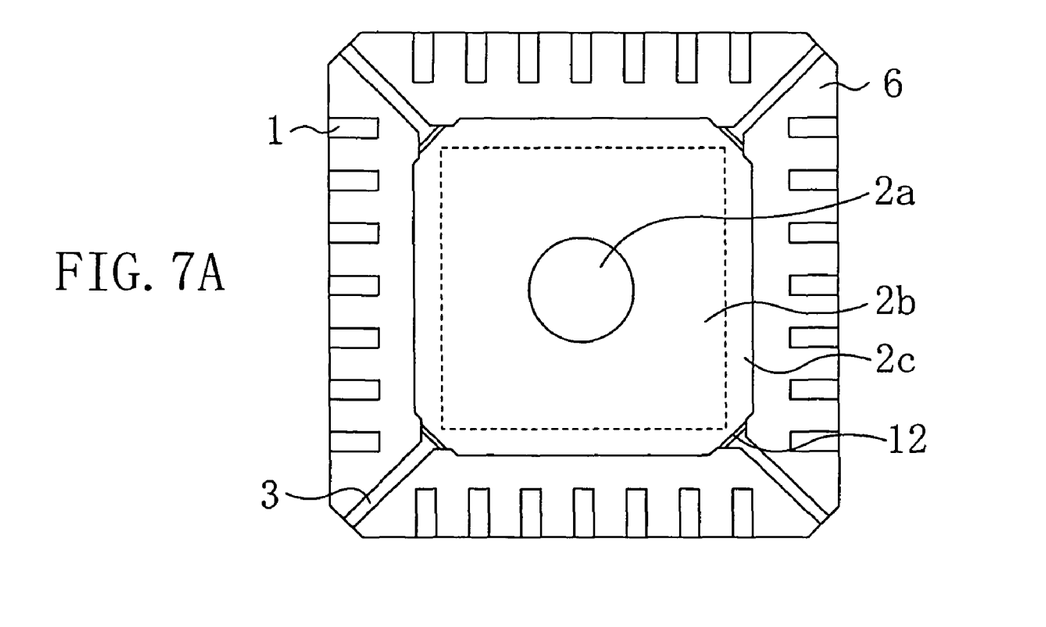
FIG. 7A is a plan view illustrating a power QFN package according to a fourth embodiment of the present invention when seen from above.
Figure 7B:
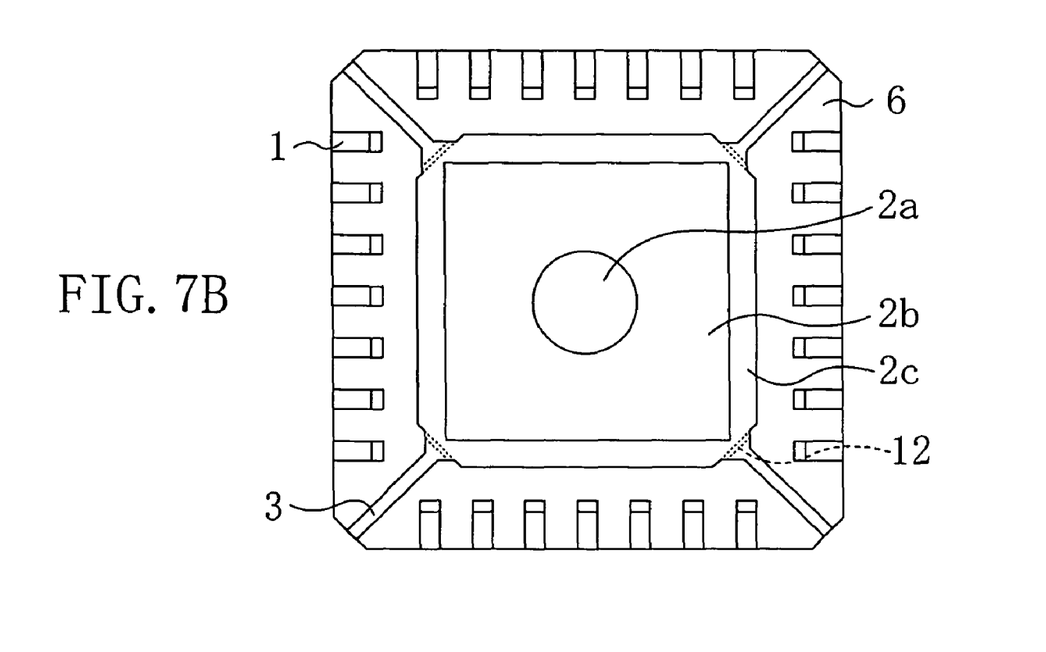
FIG. 7B is a plan view illustrating the power QFN package in FIG. 7A when seen from below.

FIG. 7A is a plan view illustrating a power QFN package according to a fourth embodiment of the present invention when seen from above. FIG. 7B is a plan view illustrating the power QFN package of this embodiment when seen from below. In FIGS. 7A and 7B, to help the understanding of the power QFN package, a semiconductor chip 4 and a resin encapsulant 6 are treated as transparent objects. No semiconductor chip is illustrated.

As illustrated in FIGS. 7A and 7B, the power QFN package of this embodiment is provided in which no recess is formed in the thin part 2c of the die pad 2 of the power QFN package of the second embodiment.

More particularly, the power QFN package of this embodiment includes a die pad 2, a semiconductor chip 4 (not shown) mounted on the top face of part of the die pad 2 and formed with an electrode pad and power semiconductor elements, a plurality of signal leads 1 provided around the die pad 2, support leads 3 for supporting the die pad 2, thin metal wires 5 through which the signal leads 1 or the die pad 2 are connected to an electrode pad (not shown) placed on the semiconductor chip 4, and a resin encapsulant 6 with which the top face of the die pad 2, the thin metal wires 5 (not shown), the support leads 3, and the top faces of the signal leads 1 are encapsulated.

In the power QFN package of this embodiment, an outer edge portion of a peripheral part 2b of the die pad 2 is formed with a thin part 2c.

In the power QFN package of this embodiment, like that of the second embodiment, while the lower part of the die pad 2 forms a generally rectangular planar shape as in the first embodiment, the upper part of the die pad 2 forms a generally octagonal planar shape. More particularly, the planar shape of the upper part of the die pad 2 is the shape of an octagon obtained by cutting away corner portions of the upper part of the rectangular die pad 2. Furthermore, as illustrated in FIG. 7A, approximately 0.2-mm-wide grooves 12 are formed in the top faces of parts of the die pad 2 to which the support leads 3 are connected, respectively. Each groove 12 extends in a direction that crosses or is orthogonal to the direction in which the corresponding support lead 3 extends. In the example illustrated in FIG. 7A, the grooves 12 are formed along four edges among the eight edges of the octagon forming the upper part of the die pad 2, respectively. However, since the upper part of the die pad 2 is encapsulated with the resin encapsulant 6, the bottom of the power QFN package of this embodiment has the same shape as the known QFN package.

In a case where the whole die pad 2 forms a rectangular planar shape, the resin encapsulant 6 usually becomes deformed after the resin encapsulation, resulting in stress concentrated at the corner portions of the die pad 2. On the other hand, since in the power QFN package of this embodiment the upper part of the die pad 2 forms a generally octagonal shape, the stress applied to the corner portions of the die pad 2 can be distributed. This can prevent separation of the die pad 2 from the resin encapsulant 6 and breaks in the thin metal wires 5. Furthermore, since grooves 12 are formed in the parts of the die pad 2 to which the support leads 3 are connected, the stress applied from each support lead 3 can be separated from the stress applied from the die pad 2 by the associated groove 12. This can prevent strong stress from being applied to the support leads 3 and the die pad 2.

The above-described configuration of the resin-encapsulated semiconductor device of the present invention can be utilized for the packaging of semiconductor chips including power elements or other elements and chips including various LSIs.

What is claimed is:

1. A lead frame comprising:
    a framework;
    a die pad placed in the framework, the die pad having a lower part and an upper part disposed on the lower part; and
    a plurality of support leads placed around the die pad for supporting the die pad,
    wherein the lower part of the die pad has a rectangular planar shape and the upper part has a polygon shape having n sides, where n is an integer of 4 or more, whose corner portions are placed apart from corner portions of the lower part of the die pad,
    the corner portions of the rectangular planar shape of the lower part project laterally from the upper part when viewed from above, and
    the corner portions of the polygon shape of the upper part projects laterally from the lower part when viewed from above.

2. The lead frame of claim 1, wherein a top face of part of the die pad to which each said support lead is connected is formed with a groove.

3. The lead frame of claim 1, wherein an outer edge portion of the upper part is formed with a thin part.

4. The lead frame of claim 3, wherein the thin part has a recess.

5. The lead frame of claim 3, wherein the thin part has at least one groove formed in at least one of top and back faces of the die pad.

6. The lead frame of claim 3, wherein a groove is further formed in a top face of the part of the upper part other than the thin part.

7. The lead frame of claim 3, wherein the thin part has a through hole.

8. A resin-encapsulated semiconductor device comprising:
    a die pad having a lower part and an upper part disposed on the lower part;
    a semiconductor chip disposed on the upper part;
    a plurality of support leads placed around the die pad for supporting the die pad; and a resin encapsulant with which a top face of the die pad and a top face of the support leads are encapsulated,
    wherein the lower part of the die pad has a rectangular planar shape and the upper part has a polygon shape having n sides, where n is an integer of 4 or more, whose corner portions are placed apart from corner portions of the lower part of the die pad,
    the corner portions of the rectangular planar shape of the lower part project laterally from the upper part when viewed from above, and
    the corner portions of the polygon shape of the upper part projects laterally from the lower part when viewed from above.

9. The resin-encapsulated semiconductor device of claim 8, wherein a top face of part of the die pad to which each said support lead is connected is formed with a groove.

10. The resin-encapsulated semiconductor device of claim 8, wherein a back face of the die pad has a recess portion at the center thereof.

11. The resin-encapsulated semiconductor device of claim 8, wherein an outer edge portion of the upper part is formed with a thin part.

12. The resin-encapsulated semiconductor device of claim 8, wherein a back face of the die pad is exposed from the resin encapsulant.

13. The resin-encapsulated semiconductor device of claim 11, wherein the thin part has a through hole.

14. The resin-encapsulated semiconductor device of claim 11, wherein the thin part has a recess.

15. The resin-encapsulated semiconductor device of claim 11, wherein the thin part has at least one groove formed in at least one of top and back faces of the die pad.

16. The resin-encapsulated semiconductor device of claim 11, wherein the thin part and the semiconductor chip overlap each other when viewed in plane.

17. The resin-encapsulated semiconductor device of claim 11, wherein a groove is further formed in the top face of part of the upper part other than the thin part.

18. A lead frame comprising:
    a framework;
    a die pad having a lower part and an upper part placed in the framework; and
    a plurality of support leads placed around the die pad for supporting the die pad, wherein:
    the lower part of the die pad has a rectangular planar shape and the upper part has a polygon shape having n sides, where n is an integer of 4 or more, whose corner portions are placed apart from corner portions of the lower part of the die pad,
    the corner portions of the rectangular planar shape of the lower part project from the upper part when viewed from above,
    a portion of the upper part projects laterally beyond a portion of the lower part,
    the die pad has a middle part and a peripheral part surrounding the middle part,
    a top face of the middle part is formed at a higher level than a top face of the peripheral part, and
    an outer edge portion of the peripheral part is formed with a thin part which forms part of the upper part of the die pad.

19. A resin-encapsulated semiconductor device comprising:
    a die pad having a lower part and an upper part;
    a semiconductor chip;
    a plurality of support leads placed around the die pad for supporting the die pad; and
    a resin encapsulant with which a top face of the die pad and a top face of the support leads are encapsulated, wherein:
    the lower part of the die pad has a rectangular planar shape and the upper part has a polygon shape having n sides, where n is an integer of 4 or more, whose corner portions are placed apart from corner portions of the lower part of the die pad, the corner portions of the rectangular planar shape of the lower part project from the upper part when viewed from above, a portion of the upper part projects laterally beyond a portion of the lower part, the die pad has a middle part and a peripheral part surrounding the middle part, the top face of the middle part of the die pad is formed at a higher level than the top face of the peripheral part, and an outer edge portion of the peripheral part is formed with a thin part which forms part of the upper part of the die pad.

* * * * *